(12) United States Patent
Yamaguchi et al.

(10) Patent No.: US 10,295,901 B2
(45) Date of Patent: May 21, 2019

(54) CURABLE COMPOSITION FOR IMPRINTING

(71) Applicant: DIC Corporation, Tokyo (JP)

(72) Inventors: Junji Yamaguchi, Sakura (JP); Hisashi Tanimoto, Sakura (JP); Takeshi Ibe, Sakura (JP); Makoto Yada, Sakura (JP); Naoto Yagi, Sakura (JP)

(73) Assignee: DIC Corporation, Tokyo (JP)

( * ) Notice: Subject to any disclaimer, the term of this patent is extended or adjusted under 35 U.S.C. 154(b) by 619 days.

(21) Appl. No.: 14/896,157

(22) PCT Filed: May 23, 2014

(86) PCT No.: PCT/JP2014/063693
§ 371 (c)(1),
(2) Date: Dec. 4, 2015

(87) PCT Pub. No.: WO2014/196381
PCT Pub. Date: Dec. 11, 2014

(65) Prior Publication Data
US 2016/0122578 A1    May 5, 2016

(30) Foreign Application Priority Data

Jun. 6, 2013 (JP) .................................. 2013-119772
Jan. 22, 2014 (JP) .................................. 2014-009455

(51) Int. Cl.
| | | |
|---|---|---|
| *G03F 7/00* | (2006.01) | |
| *C09D 4/00* | (2006.01) | |
| *G03F 7/027* | (2006.01) | |
| *G03F 7/033* | (2006.01) | |
| *C09D 133/08* | (2006.01) | |
| *C09D 133/14* | (2006.01) | |
| *C09D 141/00* | (2006.01) | |
| *C08F 222/10* | (2006.01) | |

(52) U.S. Cl.
CPC .............. *G03F 7/0002* (2013.01); *C09D 4/00* (2013.01); *C09D 133/08* (2013.01); *C09D 133/14* (2013.01); *C09D 141/00* (2013.01); *G03F 7/027* (2013.01); *G03F 7/033* (2013.01); *C08F 222/1006* (2013.01); *C08L 2312/00* (2013.01); *Y10T 428/24802* (2015.01)

(58) Field of Classification Search
CPC ........ G03F 7/0002; G03F 7/033; G03F 7/027; Y10T 428/24802
See application file for complete search history.

(56) References Cited

U.S. PATENT DOCUMENTS

| | | |
|---|---|---|
| 2007/0160937 A1 | 7/2007 | Ogino et al. |
| 2011/0236595 A1 | 9/2011 | Kodama et al. |
| 2012/0148809 A1 | 6/2012 | Kobayashi et al. |

FOREIGN PATENT DOCUMENTS

| | | | |
|---|---|---|---|
| JP | 2006152115 A | * | 6/2006 |
| JP | 2010-031240 A | | 2/2010 |
| JP | 2010-186979 A | | 8/2010 |
| JP | 4929722 B2 | | 5/2012 |
| JP | 5117002 B2 | | 1/2013 |
| WO | WO-2010/146983 A1 | | 12/2010 |
| WO | WO-2011/24673 A1 | | 3/2011 |

OTHER PUBLICATIONS

International Search Report dated Aug. 26, 2014, issued for PCT/JP2014/063693.

* cited by examiner

*Primary Examiner* — Gerard Higgins
(74) *Attorney, Agent, or Firm* — Locke Lord LLP

(57) ABSTRACT

There is provided a curable composition for imprinting containing a polymerizable compound, in which (a) the concentration of a polymerizable group in the polymerizable compound is in the range of 4.3 mmol/g to 7.5 mmol/g, (b) a polymerizable compound X whose Ohnishi parameter is 3.5 or less and ring parameter is 0.35 or greater is contained in the range of 40% by mass to 95% by mass with respect to all the polymerizable compounds, (c) a polymerizable compound C having three or more polymerizable groups is further contained in the range of 5% by mass to 20% by mass with respect to all the polymerizable compounds, and (d) the viscosity of the composition being at 25° C. and in a state of not containing a solvent is in the range of 3 mPa·s to 8,000 mPa·s.

16 Claims, No Drawings

CURABLE COMPOSITION FOR IMPRINTING

TECHNICAL FIELD

The present invention relates to a curable composition for imprinting and a method of forming a pattern using the same.

BACKGROUND ART

A nanoimprinting (NIL) method is a technique obtained by developing an embossing technique which is well-known in the production of optical disks, in which a mold on which a concave-convex pattern is formed is pressed to a resist to be dynamically deformed, thereby precisely transferring a fine pattern. Among the techniques, an optical nanoimprinting method is a technique of applying light through a transparent mold or a transparent base material, photocuring a photocurable composition, thereby performing transfer. Since it is possible to perform imprinting at room temperature, improvement of dimensional stability and improvement of a throughput are expected. When a mold is produced once, since a nanostructure having a size of ten to several hundreds of nanometers can be easily and repeatedly molded, it is economical. Further, since the technique is a nano processing technique with less hazardous waste and discharge, recently, the application of this technique to various fields has been expected.

As characteristics required for a resist used for optical nanoimprinting, etching resistance, releasing properties, filling properties in a mold, and coating properties on a substrate are exemplified. When a resist is applied to an LED, since the resist is used as a mask for forming a moth-eye structure on a substrate of the LED, pattern forming properties and dry etching resistance are required. In the hard disk drive (HDD) field, application to production of patterned media in which ten to several tens of nanometers of a periodic pattern is imprinted in the entire media is expected and filling properties (low viscosity) are required in addition to pattern forming properties and dry etching resistance. In the semiconductor field, as a method of forming a device pattern having a size of ten to several tens of nanometers, a nanoimprinting method is exemplified along with extreme ultraviolet exposure (EUV). Even in the present application, filling properties (low viscosity) and a solventless condition are required in addition to pattern forming properties and dry etching resistance.

As a polymerizable compound for imprinting, a compound having a fluorene skeleton has been known. For example, PTL 1 discloses an imprint material which includes a compound having a bisaryl fluorene skeleton, a compound having at least one polymerizable group in a molecule, and a photopolymerization initiator. Though, in PTL 1, neopentyl glycol diacrylate is exemplified as the compound having at least one polymerizable group in a molecule, the compound is not preferable from the viewpoint of degraded dry etching resistance. Moreover, since the compound having a bisaryl fluorene skeleton is contained in the range of 50 parts by mass to 95 parts by mass, the composition becomes highly viscous and pattern formation is degraded. Further, dry etching resistance is not mentioned in this literature.

Further, PTL 2 discloses a photocurable composition which contains difunctional (meth)acrylate having a fluorene skeleton. However, in this literature, the (meth)acrylate having a fluorene skeleton is used for providing curing properties, scratch resistance, rigidity, and transparency and dry etching resistance is not mentioned.

PTL 3 discloses an imprint material which includes a compound having five or more polymerizable groups in a molecule, a compound having two polymerizable groups in a molecule, and a photo-radical generator and forms a high hardness film. However, even in PTL 3, a compound with degraded dry etching resistance is used. Furthermore, dry etching resistance is not mentioned in this literature.

PTL 4 discloses a photocurable composition for optical nanoimprint lithography which includes a polymerizable compound having a primary skin irritation (PII value) of 4.0 or less and whose viscosity at 25° C. is in the range of 3 mPa·s to 18 mPa·s, but a compound with degraded dry etching resistance is used even in this literature. Moreover, etching resistance in this literature is not dry etching but wet etching.

PTL 5 discloses a photo-curable nanoimprint resist material which includes a composition containing a (meth)acrylate monomer having a cyclic structure and/or an oligomer thereof and a photopolymerization initiator, but still, a compound with degraded dry etching resistance is used in this literature.

PTL 6 discloses a curable composition for imprinting which contains (meth)acrylate having an aromatic group and a photopolymerization initiator. The composition has excellent dry etching resistance compared to (meth)acrylate of the related art, but it cannot be said that the dry etching resistance is excellent enough.

CITATION LIST

Patent Literature

[PTL 1] WO2010/146983
[PTL 2] JP-A-2010-31240
[PTL 3] WO2011/24673
[PTL 4] Japanese Patent No. 5117002
[PTL 5] Japanese Patent No. 4929722
[PTL 6] JP-A-2010-186979

SUMMARY OF INVENTION

Technical Problem

As described above, a composition having excellent pattern forming properties and a composition having high dry etching resistance have been examined. However, a composition excellent in both of pattern forming properties and dry etching resistance has not been obtained. An object of the present invention is to provide a photocurable composition for imprinting which is excellent in both of pattern forming properties and dry etching resistance.

Further, another object thereof is to provide a cured product formed of the photocurable composition for imprinting, and a base material having a pattern which is formed by etching the base material using the cured product as a mask.

Solution to Problem

As a result of intensive examination, the present inventors found that the above-described problem is solved by a photocurable composition formed of a polymerizable compound whose Ohnishi parameter and ring parameter are respectively in a specific range.

That is, the present invention provides a curable composition for imprinting, containing: a polymerizable compound, in which (a) the concentration of a polymerizable group in the polymerizable compound is in the range of 4.3 mmol/g to 7.5 mmol/g, (b) a polymerizable compound X whose Ohnishi parameter is 3.5 or less and ring parameter is 0.35 or greater is contained in the range of 40% by mass to 95% by mass with respect to all the polymerizable compounds, (c) a polymerizable compound C having three or more polymerizable groups is further contained in the range of 5% by mass to 20% by mass with respect to all the polymerizable compounds, and (d) the viscosity of the composition being at 25° C. and in a state of not containing a solvent is in the range of 3 mPa·s to 8,000 mPa·s.

In this case, the Ohnishi parameter used here is represented by $N/(N_C-N_O)$ when the total number of atoms in the polymerizable compound is set as N, the total number of carbon atoms therein is set as $N_C$, and the total number of oxygen atoms therein is set as $N_O$, and the ring parameter is represented by $M_{CYCLO}/M$ when the total atomic weight of carbon atoms in a cyclic structure in the polymerizable compound is set as $M_{CYCLO}$ and the molecular weight of the compound is set as M.

Further, the present invention solves the above-described problem by providing a cured product of the curable composition for imprinting; a method of forming a pattern on a base material, which includes a process of etching the base material using the cured product as a mask; and the base material on which a pattern obtained by the pattern forming method is formed.

Advantageous Effects of Invention

It is possible to form an excellent pattern by using a photocurable composition of the present invention. Further, since dry etching resistance is excellent, it is possible to process a base material with high precision.

DESCRIPTION OF EMBODIMENTS

Hereinafter, the contents of the present invention will be described in detail. Further, the symbol "~" in the present specification means that numerical values before and after the symbol are included as the lower limit value and the upper limit value.

In the present specification, (meth)acrylate represents acrylate and methacrylate, (meth)acryl represents acryl and methacryl, and (meth)acryloyl represents acryloyl and methacryloyl.

Moreover, the imprint in the present specification indicates pattern transfer having a size of 1 nm to 1 mm, preferably pattern transfer having a size of 5 nm to 200 µm, and more preferably pattern transfer having a size of 10 nm to 100 µm.

A curable composition for imprinting of the present invention is a curable composition containing a polymerizable compound.

The curable composition thereof has characteristics in which (a) the concentration of a polymerizable group in the range of 4.3 mmol/g to 7.5 mmol/g, (b) a polymerizable compound X whose Ohnishi parameter is 3.5 or less and ring parameter is 0.35 or greater is contained in the range of 40% by mass to 95% by mass with respect to all the polymerizable compounds, (c) a polymerizable compound C having three or more polymerizable groups is further contained in the range of 2% by mass to 20% by mass with respect to all the polymerizable compounds, and (d) the viscosity of the composition being at 25° C. and in a state of not containing a solvent is in the range of 3 mPa·s to 8,000 mPa·s.

The polymerizable compound in the present invention is a compound having a polymerizable group and the polymerizable group indicates at least one organic group selected from a group consisting of a (meth)acryloyl group, a vinyl group, and an allyl group.

The concentration of the polymerizable group in the present invention indicates concentration (f) (mmol/g) of a polymerizable group per 1 g of a polymerizable compound acquired by the following Equation (A).

$$(f)=(a_0 \cdot c_0/M_0)+(a_1 \times c_1/M_1)+ \ldots (a_n \times c_n/M_n) \tag{A}$$

(In the equation, $a_0, a_1, \ldots a_n$ represent % by weight of respective components of the polymerizable compound constituting the curable composition (hereinafter, simply referred to as respective components); $c_0, c_1, \ldots, c_n$ represent the number of polymerizable groups of respective components; and $M_0, M_1, \ldots M_n$ represent the molecular weight of respective components.)

In the equation, (f) is in the range of 4.3 mmol/g to 7.5 mmol/g and preferably in the range of 4.3 mmol/g to 7.0 mmol/g. The curing properties are degraded when (f) is less than 4.3 and curing contraction is increased when (f) is greater than 7.5 and thus adhesiveness to a base material is degraded, which is not preferable.

The Ohnishi parameter is represented by $N/(N_C-N_O)$ when the total number of atoms in the polymerizable compound is set as N, the total number of carbon atoms therein is set as $N_C$, and the total number of oxygen atoms therein is set as $N_O$, and the ring parameter is a parameter serving as an index of dry etching resistance represented by $M_{CYCLO}/M$ when the total atomic weight of carbon atoms in a cyclic structure in the polymerizable compound is set as $M_{CYCLO}$ and the molecular weight of the compound is set as M. In general, it is known that the dry etching resistance becomes excellent when the Ohnishi parameter becomes smaller and the ring parameter becomes greater.

When the Ohnishi parameter is preferably 3.5 or less, more preferably 3.0 or less, and particularly preferably 2.6 or less, dry etching resistance becomes excellent, which is preferable. Further, when the ring parameter is preferably 0.35 or greater, more preferably 0.40 or greater, and particularly preferably 0.45 or greater, dry etching resistance becomes excellent, which is preferable. In the imprint composition of the present invention, pattern forming properties and dry etching resistance can be both satisfied when a polymerizable compound X whose Ohnishi parameter is 3.5 or less and ring parameter is 0.35 or greater is contained in the range of 40% by mass to 95% by mass with respect to all the polymerizable compounds.

In addition, the curable composition for imprinting of the present invention contains a polymerizable compound C having three or more polymerizable groups. When the curable composition contains the polymerizable compound C, pattern forming properties and curing properties become excellent. The content thereof is in the range of 2% by mass to 20% by mass and more preferably in the range of 2% by mass to 15% by mass with respect to all the polymerizable compounds. When the content thereof exceeds 20% by mass, curing contraction is increased and thus pattern forming properties are degraded. In addition, when the content thereof is less than 2% by mass, cohesive force of a cured product becomes weaker and thus cohesion failure is likely to occur at the time of releasing a mold.

In the curable composition for imprinting of the present invention, the viscosity of the curable composition being at 25° C. and in a state of not containing a solvent is in the range of 3 mPa·s to 8,000 mPa·s, preferably in the range of 3 mPa·s to 2,000 mPa·s, and particularly preferably in the range of 3 mPa·s to 500 mPa·s. When the viscosity is in the above-described range, excellent coating properties can be obtained and the amount of a solvent to be used at the time of adjusting the viscosity can be reduced.

The curable composition for imprinting of the present invention is not particularly limited as long as specific ranges of the concentration of the polymerizable group, the Ohnishi parameter, and the ring parameter are satisfied. In addition, it is preferable that a polymerizable compound A having an aromatic ring and a polymerizable group and a polymerizable compound B represented by the following Formula (1), (2), or (3) are contained as a polymerizable compound X whose Ohnishi parameter is 3.5 or less and ring parameter is 0.35 or greater.

[Chem. 1]

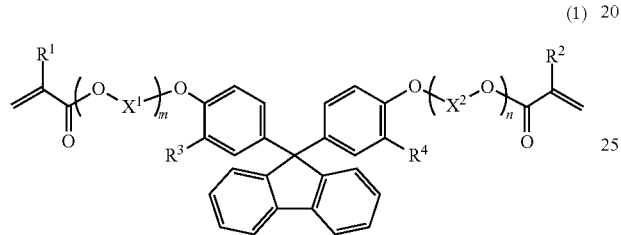

(1)

In the formula, $R^1$, $R^2$, $R^3$, and $R^4$ each independently represent H or $CH_3$, $X^1$ and $X^2$ each independently represent a hydrocarbon group having 2 or more carbon atoms, and m and n each independently represent an integer of 0 or 1 to 5.

[Chem. 2]

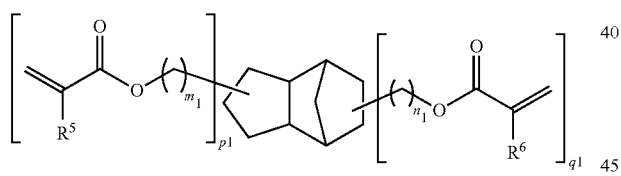

(2)

In the formula, $R^5$ and $R^6$ each independently represent H or $CH_3$, $m_1$ and $n_1$ each represent 0 or 1, and $p_1$ and $q_1$ represent an integer satisfying a relationship of "$p_1+q_1=1$ or 2."

[Chem. 3]

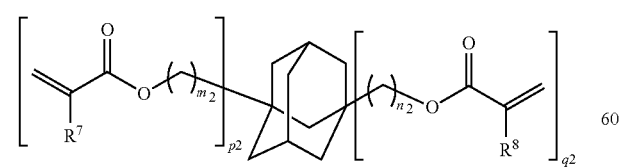

(3)

In the formula, $R^7$ and $R^8$ each independently represent H or $CH_3$, $m_2$ and $n_2$ each represent 0 or 1, and $p_2$ and $q_2$ represent an integer satisfying a relationship of "$p_2+q_2=1$ or 2."

The polymerizable compound A can be used alone or in combination of two or more kinds thereof.

Further, the polymerizable compound B can be used alone or in combination of two or more kinds thereof.

Since the pattern forming properties and dry etching resistance of the curable composition for imprinting become excellent, it is preferable that the polymerizable compound A having an aromatic ring and a polymerizable group and the polymerizable compound B represented by Formula (1) and/or (2) are contained.

As the polymerizable compound A having an aromatic ring and a polymerizable group, a compound represented by any of the following Formulae (4) to (8) is preferable.

[Chem. 4]

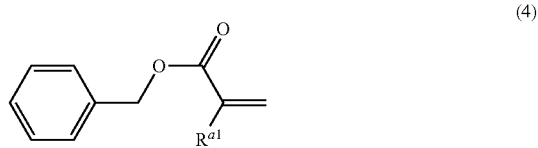

(4)

[Chem. 5]

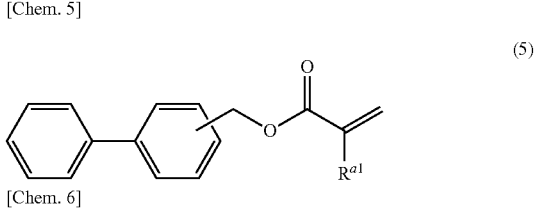

(5)

[Chem. 6]

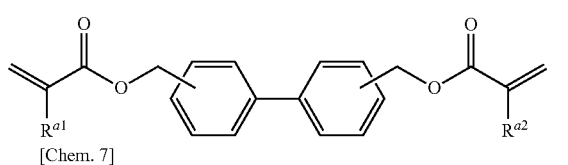

(6)

[Chem. 7]

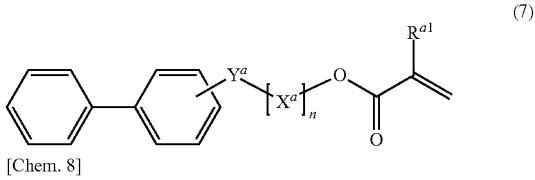

(7)

[Chem. 8]

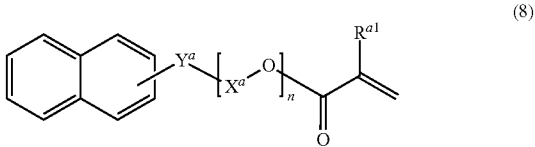

(8)

In Formulae (4) to (8), $R^{a1}$ and $R^{a2}$ each independently represent H or $CH_3$, $X^a$ represents a hydrocarbon group having 2 or more carbon atoms, $Y^a$ represents an oxygen atom or a sulfur atom, and n represents an integer of 0 or 1 to 5.

Since a compound represented by any of Formulae (4) to (8) has a phenyl group, a biphenyl group, or a naphthyl group and thus the dry etching resistance becomes excellent and the viscosity becomes low, it is possible to make the viscosity of the curable composition low by combining the compound and the component B having high viscosity. Particularly, a compound which is represented by any of Formulae (5) to (8) and has a biphenyl group or a naphthyl group has superior dry etching resistance to that of a compound which is represented by Formula (4) and has a phenyl group.

It is preferable that the viscosity of the compound represented by any of Formulae (4) to (8) at 25° C. is 200 mPa·s or less. In addition, the compound represented by any of Formulae (4) to (8) can be used alone or in combination of two or more kinds thereof.

A compound which is represented by Formula (1) and has a bisaryl fluorene skeleton is a commercially available product, and examples thereof include OGSOL (registered trademark) EA-0200, OGSOL EA-F5003, OGSOL EA-F5503, and OGSOL EA-F5510 (all manufactured by Osaka Gas Chemicals Co., Ltd.); and NK Ester A-BPEF (manufactured by Shin-Nakamura Chemical Co., Ltd.).

A compound which is represented by Formula (2) and includes a tricyclodecane skeleton is a commercially available product, and examples thereof include NK Ester (registered trademark) A-DCP (manufactured by Shin-Nakamura Chemical Co., Ltd.); MIRAMER M-260 (manufactured by Miwon Commercial Co., Ltd.); and FANCRYL FA-513AS and FANCRYL FA-513M (both manufactured by Hitachi Chemical Co, Ltd.).

A compound which is represented by Formula (3) and includes an adamantane skeleton is a commercially available product, and examples thereof include ADAMANTATE (registered trademark) DMODA (manufactured by Idemitsu Kosan Co., Ltd.) and ADAMANTATE DA (manufactured by Idemitsu Kosan Co., Ltd.).

When the total content of the polymerizable compound A and the polymerizable compound B is set as 100 parts by mass, it is preferable that the content of the polymerizable compound A is set such that the weight ratio of the polymerizable compound A to the polymerizable compound B is in the range of 95:5 to 55:45. When the compound A is in the above-described range, since the viscosity of the composition is sufficiently low, the pattern forming properties become excellent.

The curable composition for imprinting of the present invention contains a polymerizable compound C having three or more polymerizable groups in a molecule in addition to the polymerizable compound X. Specific examples of the polymerizable compound C include dipentaerythritol hexa(meth)acrylate, dipentaerythritol penta(meth)acrylate, pentaerythritol tetra(meth)acrylate, pentaerythritol tri (meth))acrylate, ditrimethylolpropane tetra(meth))acrylate, trimethylolpropane tri(meth)acrylate, alkylene oxide-modified trimethylolpropane tri(meth)acrylate, ethoxylated isocyanuric acid tri(meth)acrylate, glycerin tri(meth)acrylate, and alkylene oxide-modified glycerin tri(meth)acrylate.

The polymerizable compound C is a commercially available product, and examples thereof include KAYARAD (registered trademark) DPHA, KAYARAD DPCA-20, KAYARAD DPCA-30, and KAYARAD DPCA-60 (all manufactured by NIPPON Kayaku Co., Ltd.); ARONIX (registered trademark) M-403, ARONIX M-400, ARONIX M-306, ARONIX M-303, ARONIX M-408, ARONIX M-309, ARONIX M-310, ARONIX M-350, ARONIX M-315, and ARONIX M-460 (all manufactured by TOAGOSEI CO., LTD.); NK Ester (registered trademark) A-DPH, A-TMMT, AD-IMP, A-TMPT, A-GLY-9E, and A-9300 (all manufactured by Shin-Nakamura Chemical Co., Ltd.).

Among these, dipentaerythritol hexa(meth)acrylate, dipentaerythritol penta(meth)acrylate, pentaerythritol tetra (meth)acrylate, or pentaerythritol tri(meth)acrylate is preferable. The content thereof is in the range of 2% by mass to 20% by mass and more preferably in the range of 2% by mass to 15% by mass with respect to all the polymerizable compounds. When the content thereof is 20% by mass or greater, curing contraction is increased and adhesiveness to a base material and pattern forming properties are degraded. Further, when the content thereof is less than 2% by mass, the cohesive force of a cured product becomes weaker and thus cohesion failure is likely to occur at the time of releasing from a mold.

The curable composition for imprinting of the present invention may contain a photopolymerization initiator. Examples thereof include 2,2-dimethoxy-1,2-diphenylethan-1-one, 1-hydroxy-cyclohexyl-phenyl-ketone, 1-[4-(2-hydroxyethoxy)-phenyl]-2-hydroxy-2-methyl-1-propan-1-one, 2-methyl-1-[4-(methylthio)phenyl]-2-morpholinopropan-1-one, 2-benzyl-2-dimethylamino-1-(4-morpholinophenyl)-butanone-1, bis(2,4,6-trimethylbenzoyl)-phenyl phosphine oxide, 2-hydroxy-1-{4-[4-(2-hydroxy-2-methyl-propionyl)-benzyl]-phenyl}-2-methyl-propane, 1,2-octanedione, 1-[4-(phenylthio)-, 2-(O-benzoyloxime)], 2-hydroxy-2-methyl-1-phenyl-propan-1-one, phenyl glyoxylic acid methyl ester, and 2,4,6-trimethylbenzoyl-diphenyl-phosphine oxide, but the curable composition is not particularly limited as long as the composition absorbs a light source to be used at the time of photocuring.

The compound is a commercially available product and examples thereof include IRGACURE (registered trademark) 651, IRGACURE 184, IRGACURE 2959, IRGACURE 907, IRGACURE 369, IRGACURE 819, IRGACURE 127, IRGACURE OXE01, DAROCUR (registered trademark) 1173, DAROCUR MBF, and DAROCUR TPO (all manufactured by BASF Japan Ltd.); and ESACURE (registered trademark) KIP150, ESACURE TZT, ESACURE KT046, ESACURE 1001M, ESACURE KB1, ESACURE KS300, ESACURE KL200, ESACURE TPO, ESACURE ITX, and ESACURE EDB (all manufactured by SiberHegner & Co.).

The above-described photopolymerization initiator can be used alone or in combination of two or more kinds thereof.

The content of the photopolymerization initiator in the curable composition for imprinting of the present invention is preferably in the range of 0.5% by mass to 20% by mass and more preferably in the range of 1% by mass to 10% by mass with respect to all the polymerizable compounds. When the content thereof is 0.5% by mass or greater, the curing properties are improved and the pattern forming properties become excellent.

The curable composition for imprinting of the present invention may contain a solvent.

When the curable composition contains a solvent, the viscosity thereof can be adjusted. Examples of the solvent include aliphatic or alicyclic hydrocarbons such as n-hexane, n-heptane, n-octane, cyclohexane, and cyclopentane; aromatic hydrocarbons such as toluene, xylene, and ethyl benzene; alcohols such as methanol, ethanol, n-butanol, ethylene glycol monomethyl ether, and propylene glycol monomethyl ether; esters such as ethyl acetate, n-butyl acetate, isobutyl acetate, ethylene glycol monomethyl ether acetate, and propylene glycol monomethyl ether acetate; ketones such as acetone, methyl ethyl ketone, methyl isobutyl ketone, and cyclohexanone; polyalkylene glycol dialkyl ethers such as diethylene glycol dimethyl ether, and diethylene glycol dibutyl ether; ethers such as 1,2-dimethoxyethane, tetrahydrofuran, and dioxane; N-methyl pyrrolidone; dimethylformamide; and dimethylacetamide. The solvent can be used alone or in combination of two or more kinds thereof.

In a case where a solvent is used, the content of the solvent can be adjusted within a range in which the content of components other than the solvent in the curable composition is in the range of 0.1% by mass to 100% by mass as needed.

The curable composition for imprinting of the present invention may contain a compound having a polymerizable group other than the above-described polymerizable compounds X and C as needed. Examples thereof include neopentyl glycol di(meth)acrylate, 1,4-butanediol di(meth) acrylate, 1,6-hexanediol di(meth)acrylate, 1,9-nonanediol di(meth)acrylate, ethylene glycol di(meth)acrylate, polyethylene glycol di(meth)acrylate, dipropylene glycol di(meth) acrylate, tripropylene glycol di(meth)acrylate, polypropylene glycol di(meth)acrylate, alkylene oxide-modified bisphenol A di(meth)acrylate, alkylene oxide-modified bisphenol F di(meth)acrylate, phenoxy ethyl(meth)acrylate, phenol EO-modified (meth)acrylate, nonyl phenol EO-modified (meth)acrylate, lauryl(meth)acrylate, 2-hydroxyethyl(meth)acrylate, isobornyl(meth)acrylate, cyclohexyl(meth)acrylate, benzyl(meth)acrylate, tetrahydrofurfuryl(meth)acrylate, ethyl carbitol(meth)acrylate, 3-ethyl-3-oxetanylmethyl(meth)acrylate, 1-adamantyl(meth)acrylate, and γ-butyrone(meth)acrylate.

The compound is a commercially available product and examples thereof include ARONIX (registered trademark) M-208, ARONIX M-211B, ARONIX M-220, ARONIX M-225, ARONIX M-240, ARONIX M-101A, and ARONIX M-113 (all manufactured by TOAGOSEI CO., LTD.); NK Ester (registered trademark) A-200, A-BPE-4, A-HD-N, A-NOD-N, APG-100, APG-200, and AMP-20GY (all manufactured by Shin-Nakamura Chemical Co., Ltd.); and VISCOAT #195, VISCOAT #230, VISCOAT #260, VISCOAT #310HP, VISCOAT #335HP, VISCOAT #700, VISCOAT #155, VISCOAT #160, VISCOAT #192, VISCOAT #150, VISCOAT #190, IBXA, OXE-10, 1-ADA, GBLA, and LA (all manufactured by OSAKA ORGANIC CHEMICAL INDUSTRY LTD.).

The curable composition for imprinting of the present invention may contain a photosensitizer, an ultraviolet absorber, an antioxidant, a surfactant, an adhesion auxiliary agent, an inorganic filler, an organic filler, or a pigment as needed.

Examples of the above-described surfactant include a known fluorine-based surfactant, a silicone-based surfactant, and an acrylic polymer-based surfactant. The content of the surfactant is in the range of 0.001% by mass to 10% by mass, preferably in the range of 0.01% by mass to 8% by mass, and more preferably in the range of 0.1% by mass to 5% by mass with respect to all the polymerizable compounds. In a case where two or more kinds of surfactants are used, the total content thereof is adjusted to be within the above-described range. When the content of the surfactant is in the above-described range, uniformity in coating becomes excellent and mold transferability becomes excellent as well.

A pattern forming method using the curable composition for imprinting of the present invention will be described. A pattern can be formed by performing a process of coating a base material with the curable composition for imprinting of the present invention and forming a pattern forming layer and then performing a process of irradiating the pattern forming layer with light.

Examples of the method of coating a base material with the curable composition for imprinting of the present invention include a spray method, a spin coating method, a dip method, a roll coating method, a blade coating method, a doctor roll method, a doctor blade method, a curtain coating method, a slit coating method, a screen printing method, and an ink-jet method.

The base material which is coated with the curable composition for imprinting of the present invention can be selected according to various applications, and examples thereof include quartz, sapphire, glass, an optical film, a ceramic material, a vapor deposition film (CVD, PVD, or sputtering), a magnetic film, a reflective film, a metal substrate such as Ni, Cu, Cr, Fe, or stainless steel, paper, spin on glass (SOG), spin on carbon (SOC), a polymer substrate such as a polyester film, a polycarbonate film, or a polyimide film, a conductive base material such as a TFT array substrate, a PDP electrode plate, ITO, or a metal, an insulating base material, and a semiconductor preparation substrate such as silicon, silicon nitride, polysilicon, silicon oxide, or amorphous silicon.

Moreover, the shape of the base material is not particularly limited and may be arbitrary according to the purpose, for example, a flat plate, sheet, or a three-dimensional shape whose surface is entirely or partially curved. Further, the hardness or the thickness of the base material is not limited.

In a case of pattern formation using a mold, a cured film on which a pattern is formed is obtained by pressing a mold on which a pattern is formed in advance to a film prepared by the above-described method and allowing the film to be cured in a state in which the film is in contact with the mold. The curable composition for imprinting of the present invention can be suitably used particularly for forming a pattern having a size of 100 nm or less.

Examples of a material of a mold for imprinting, as a material that transmits light, include quartz; ultraviolet transmitting glass; sapphire; diamond; or a silicon material such as polydimethyl siloxane; a fluorine resin; and another resin material that transmits light. Further, when a base material to be used is a material that transmits light, the mold for imprinting may be formed of a material that does not transmit light. As the material that does not transmit light, a metal, SiC, mica, or the like is exemplified.

The shape of the mold for imprinting can be selected from arbitrary shapes, for example, a flat surface shape, a belt shape, a roll shape, and a roll belt shape.

As the mold for imprinting, a mold subjected to a release treatment may be used for the purpose of improving releasing properties between the curable composition and the surface of the mold. As the release treatment, a treatment using a silicon-based or fluorine-based silane coupling agent is exemplified.

Examples of the method of curing the curable composition include a method of irradiating the curable composition with light from the mold side in a case where the mold is formed of a material that transmits light; and a method of irradiating the curable composition with light from the base material side in a case where the base material is formed of a material that transmits light. The light used for light irradiation is not limited as long as a photopolymerization initiator reacts with light. From the viewpoint that a photopolymerization initiator easily reacts and curing at a lower temperature is possible, light having a wavelength of 450 nm or shorter (active energy rays such as ultraviolet rays, X-rays, and γ-rays) is preferable.

Moreover, when there is a failure in the followability of a pattern to be formed, the curable composition may be heated to a temperature at which sufficient fluidity can be obtained at the time of light irradiation. The temperature at the time of heating is preferably in the range of 0° C. to 300° C., more preferably in the range of 0° C. to 200° C., still more preferably in the range of 0° C. to 150° C., and particularly preferably in the range of 25° C. to 80° C. In the temperature range described above, the shape of the pattern to be formed from the curable composition is held with high precision.

After the curing, a cured film on which a convex-concave pattern obtained by transferring a concave-convex pattern of the mold is formed is obtained. In order that deformation of a base material such as warpage is suppressed and the precision of the concave-convex pattern is increased, a method in which a peeling process is carried out after the temperature of the cured film is decreased to approximately room temperature (25° C.) is preferable.

A pattern can be favorably formed on the base material by performing dry etching on a laminate having a cured film on which a pattern is formed by the above-described method and a pattern forming material on which the pattern is formed by the dry etching is obtained.

Since the cured film formed of the curable composition for imprinting of the present invention has excellent dry etching resistance, the pattern or the like is unlikely to collapse at the time of dry etching and a fine etching pattern can be provided.

As the gas used for dry etching, known gas may be used and examples thereof include oxygen atom-containing gas such as oxygen, carbon monoxide, or carbon dioxide; inert gas such as helium, nitrogen, or argon; chlorine-based gas such as chlorine or boron chloride; fluorine gas; hydrogen gas; and ammonia gas. Further, the above-described gas may be used alone or in a mixture as appropriate.

A desired pattern can be formed on the base material by carrying out etching using such etching gas.

EXAMPLES

Hereinafter, the present invention will be described in detail with reference to Examples and Comparative Examples, but the present invention is not limited to these Examples.

Synthesis Example 1

Synthesis of Compound A-1

<Synthesis of Chloro Intermediate>

709 g of diphenyl, 276 g of paraformaldehyde, 1381 g of acetic acid, and 958 g of concentrated hydrochloric acid were added to a 5 L four-necked flask on which a stirrer, a cooling tube, a thermometer, and a chlorine gas introduction device were mounted, and the temperature of the flask was increased to 80° C. After it was confirmed that the temperature of a solution of the mixture reached 80° C., hydrogen chloride gas was introduced to the solution of the mixture at a rate of 20 g/hr using a Kinoshita type glass ball filter. After it was confirmed that dissolution of hydrogen chloride gas in the solution of the mixture was saturated, 1061 g of phosphoric acid was added dropwise over 1 hour to be further reacted for 30 hours. After the reaction was finished, a lower layer was immediately removed from the reaction solution, 2.3 kg of toluene was added to an organic layer, and the organic layer was washed with 400 g of a 12.5% sodium hydroxide aqueous solution, a saturated sodium bicarbonate aqueous solution, and distilled water. The organic layer was distilled off, thereby obtaining 900 g of a chloro intermediate as a white solid.

<Acryloylation>

908 g of the intermediate was dissolved in 1603 g of dimethylformamide (DMF) serving as a reaction solvent, and then 372 g of potassium carbonate added thereto, and methoquinone were added thereto such that the concentration of methoquinone was set to be 300 ppm with respect to the total amount of the solution. The temperature of the intermediate solution was increased to 40° C. and 323 g of acrylic acid was added dropwise to the intermediate solution over 1.5 hours. After the dropwise addition was finished, the temperature of the mixture was increased to 80° C. over 2 hours and the mixture was heated and stirred at 80° C. for 3 hours. After 3.4 kg of water and 1.8 kg of toluene were added to the obtained solution and extraction was performed, an organic layer was washed until the layer became neutral. The organic layer was concentrated and 995 g of a compound A-1 was obtained. The compound A-1 was in a liquid state at 25° C.

Gas chromatography analysis was performed on the compound A-1 obtained in the above-described method, under the following conditions.

Device: "6850 Series" manufactured by Agilent Technologies Japan, Ltd.
Column: Agilent DB-1
Carrier gas: He, flow rate of 1 mL/min
Injection temperature: 300° C.
Detection temperature: 300° C.
Program: 50° C. to 325° C. (temperature rising rate of 25° C./min)

When the composition ratio was acquired using gas chromatogram, monofunctional acrylate (in Formula (5), $R^{a1}$=H, ortho-isomer:para-isomer:meta-isomer=20:79:1) was 71.0%, difunctional acrylate (in Formula (6), $R^{a1}$=$R^{a2}$=H) was 20.2%, and others were 8.8%.

Examples 1 to 18 and Comparative Examples 1 to 10

Curable compositions were obtained based on composition tables shown in Tables 1 to 3 below.

<Method of Measuring Composition Viscosity>

The viscosity was measured using a cone-plate type of an E type viscometer ("TV-20" manufactured by TOKI SANGYO CO., LTD.) at 25±0.2° C.

<Optical Imprinting Method>

A nanoimprinting device X300 (manufactured by SCIVAX Corporation) was used for optical imprinting. A sapphire base material was coated with compositions shown in Examples 1 to 15 and Comparative Examples 1 to 10 to have a film thickness of 150 nm using a spin coater, a flat plate-like mold made of quartz glass having a line and space structure with a width of 200 nm, a pitch of 400 nm, and a height of 200 nm was pressed to the surface thereof, light with a light intensity of 1,000 mJ/cm² was applied from the mold side in this state using an LED light source having a peak wavelength of 365±5 nm such that the surface was cured, and the mold and the sapphire base material were peeled off from each other, thereby obtaining a resist film which was a cured product having a line and space-like pattern.

Further, the compositions shown in Examples 16 to 18 were formed on three sides such that 15 pL of droplets had a droplet interval of 340 μm on a sapphire base material using an ink-jet dispenser PQ512/15 (manufactured by FUJIFILM Corporation). Next, a flat plate-like mold made of quartz glass having a line and space structure with a width of 200 nm, a pitch of 400 nm, and a height of 200 nm was pressed to the surface thereof, light with a light intensity of 1,000 mJ/cm$^2$ was applied from the mold side in this state using an LED light source having a peak wavelength of 365±5 nm such that the surface was cured, and the mold and the sapphire base material were peeled off from each other, thereby obtaining a resist film which was a cured product having a line and space-like pattern.

<Imprint Aptitude Evaluation Method and Evaluation Criteria>

(Evaluation of Pattern Formation)

The obtained pattern of a resist film was observed at a magnification of 100,000 times using a scanning microscope (JSM-7500F, manufactured by JEOL Ltd.), and evaluation was performed based on the following criteria.

(Shape)

A: The height of the line shape was 190 nm or greater.

B: The height of the line shape was in the range of 180 nm to less than 190 nm.

C: The height of the line shape was less than 180 nm.

(Releasing Properties)

A: The pattern was not defected or collapsed.

B: Only a part of the pattern was peeled at the interface between the substrate and the resist.

C: Most of the surface or the entire surface of the pattern was peeled defected, or collapsed at the interface between the substrate and the resist.

<Dry Etching Resistance Evaluation Method>

(Preparation of Resist Film)

A silicon wafer base material was coated with compositions shown in Examples 1 to 18 and Comparative Examples 1 to 10 to have a film thickness of 1 µm using spin coating, and light with a light intensity of 1,000 mJ/cm$^2$ was applied from the resin composition side using an LED light source having a peak wavelength of 365±5 nm such that the surface was cured, thereby obtaining a resist film.

In the same manner, a sapphire base material was coated with compositions shown in Examples 1 to 18 and Comparative Examples 1 to 10, and light with a light intensity of 1,000 mJ/cm$^2$ was applied from the resin composition side using an LED light source having a peak wavelength of 365±5 nm such that the surface was cured, thereby obtaining a resist film which was a cured film.

(Dry Etching Method)

A gas mixture of $CF_4/O_2$ was supplied to the obtained resist film such that the flow rates of $CF_4$ and $O_2$ were respectively 40 sccm and 10 sccm using Desktop Series Plasma Etching (manufactured by Youtec Co., Ltd.), plasma dry etching was performed under vacuum at 0.8 Pa for 1 minute, and the residual film thickness of the resist film was measured, and then the etching rate per minute was calculated.

In the same manner, a mixture of $BCl_3/Cl_2/Ar$ was supplied to the obtained resist film such that the flow rates of $BCl_3$, $Cl_2$, and Ar were respectively 20 sccm, 15 sccm, and 20 sccm using RIE-101iPH (manufactured by SAMCO Inc.), plasma etching was performed under vacuum at 0.7 Pa for 1 minute, and the residual film thickness of the resist film was measured, and then the etching rate per minute was calculated.

(Criteria of Evaluation Method)

The obtained etching rate was standardized such that the value of Comparative Example 5 was 1. It is indicated that the dry etching resistance is more excellent as the standard value becomes smaller, and evaluation was performed based on the following criteria.

A: The standardized etching rate was less than 0.8.

B: The standardized etching rate was in the range of 0.8 to less than 1.

C: The standardized etching rate was 1 or greater.

TABLE 1

| Components | | | Concentration of polymerizable group (mmol/g) | Ohnishi parameter | Ring parameter | Examples | | | | | | | | |
|---|---|---|---|---|---|---|---|---|---|---|---|---|---|---|
| | | | | | | 1 | 2 | 3 | 4 | 5 | 6 | 7 | 8 | 9 |
| Polymerizable compound A | A-1 | PBA | 4.23 | 2.16 | 0.52 | 65 | | | | 55 | | 90 | | 30 |
| | A-2 | OPPEA | 3.73 | 2.57 | 0.54 | | 60 | 50 | | | 60 | | | |
| | A-3 | HRI-02 | 3.87 | 2.46 | 0.465 | | | | 80 | | | | 60 | |
| | A-4 | BZA | 6.17 | 2.75 | 0.44 | | | | | | | | | |
| Polymerizable compound B | FDA | | 3.66 | 2.45 | 0.55 | 25 | 30 | | 10 | | 30 | 5 | | 10 |
| | TCDDA | | 6.57 | 3.29 | 0.39 | | | 40 | | 40 | | | 30 | |
| | ADMODA | | 6.57 | 3.29 | 0.39 | | | | | | | | | |
| Photopolymerization initiator | IRGACURE 184 | | | | | 4 | 4 | 4 | 4 | 4 | 4 | 4 | 4 | 4 |
| | DAROCUR TPO | | | | | 1 | 1 | 1 | 1 | 1 | 1 | 1 | 1 | 1 |
| | IRGACURE 907 | | | | | | | | | | | | | |
| | IRGACURE OXE 01 | | | | | | | | | | | | | |
| Polymerizable compound C | DPHA | | 10.08 | 5.11 | 0 | 10 | 10 | 10 | 10 | 6 | 10 | 5 | 20 | 10 |
| | EO-TMPTA | | 10.12 | 4.56 | 0 | | | | | | | | | |
| Surfactant | UV-3500 | | | | | 5 | | | | 5 | | | | |
| | F-554 | | | | | | 0.1 | | | | 0.1 | | | |
| | R-08 | | | | | | | | | | | | | |
| Solvent | PGMAc | | | | | | | | | | 105.1 | | | |
| Polymerizable compound other than A, B, and C | NPGDA | | 9.42 | 4.43 | 0 | | | | | | | | | 50 |
| | TPGDA | | 6.66 | 5.00 | 0 | | | | | | | | | |
| | BPADA | | 4.52 | 3.63 | 0.33 | | | | | | | | | |
| Total | | | | | | 110 | 105 | 105 | 105 | 111 | 210 | 105 | 115 | 105 |
| Viscosity (without solvent) | | | | | | 300 | 1100 | 200 | 150 | 60 | 1100 | 50 | 150 | 60 |
| Concentration of acryloyl group of all polymerizable compounds | | | | | | 4.7 | 4.3 | 5.5 | 4.5 | 5.5 | 4.3 | 4.5 | 5.7 | 7.4 |
| Ratio of polymerizable compounds having Ohnishi parameter of <3.5, ring parameter of >0.35 or greater (% by mass) | | | | | | 90 | 90 | 90 | 90 | 94 | 90 | 95 | 82 | 40 |

TABLE 1-continued

| Components | | | Concentration of polymerizable group (mmol/g) | Ohnishi parameter | Ring parameter | Examples | | | | | | | | |
|---|---|---|---|---|---|---|---|---|---|---|---|---|---|---|
| | | | | | | 1 | 2 | 3 | 4 | 5 | 6 | 7 | 8 | 9 |
| Ratio A/(A + B) with respect to components A and B (%) | | | | | | 72.2 | 66.7 | 55.6 | 88.9 | 57.9 | 66.7 | 94.7 | 66.7 | 75.0 |
| Ratio of component C (% by mass) | | | | | | 9.5 | 10.0 | 10.0 | 10.0 | 5.7 | 10.0 | 5.0 | 18.2 | 10.0 |
| Imprint aptitude | | | Shape (height) | | | A | A | A | A | A | A | A | A | A |
| | | | Releasing from a mold (on mold) | | | A | A | A | A | A | A | A | B | A |
| Dry etching resistance (E/R) | | | BCl3/Cl2/Ar: Sapphire | | | A | A | B | A | A | A | A | A | B |
| | | | CF4/O2: Si | | | A | A | B | A | A | A | A | A | B |

TABLE 2

| Components | | | Concentration of polymerizable group (mmol/g) | Ohnishi parameter | Ring parameter | Examples | | | | | | | | |
|---|---|---|---|---|---|---|---|---|---|---|---|---|---|---|
| | | | | | | 10 | 11 | 12 | 13 | 14 | 15 | 16 | 17 | 18 |
| Polymerizable compound A | A-1 | PBA | 4.23 | 2.16 | 0.52 | 35 | | 30 | 50 | | 40 | 50 | 25 | 15 |
| | A-2 | OPPEA | 3.73 | 2.57 | 0.54 | | 35 | | | 50 | | | | |
| | A-3 | HRI-02 | 3.87 | 2.46 | 0.465 | | | | | | | | | |
| | A-4 | BZA | 6.17 | 2.75 | 0.44 | 30 | 30 | 25 | | | | 35 | 30 | 45 |
| Polymerizable compound B | | FDA | 3.66 | 2.45 | 0.55 | | 25 | 33 | 20 | | 5 | 10 | | |
| | | TCDDA | 6.57 | 3.29 | 0.39 | 25 | | | 15 | | | | 35 | 35 |
| | | ADMODA | 6.57 | 3.29 | 0.39 | | | | | 40 | | | | |
| Photo-polymerization initiator | | IRGACURE 184 | | | | 4 | 4 | 4 | 4 | 4 | 4 | 1 | 1 | 1 |
| | | DAROCUR TPO | | | | 1 | 1 | 1 | 1 | 1 | 1 | 2 | 2 | 2 |
| | | IRGACURE 907 | | | | | | | | | | | | |
| | | IRGACURE OXE 01 | | | | | | | | | | | | |
| Polymerizable compound C | | DPHA | 10.08 | 5.11 | 0 | 10 | 10 | 2 | 15 | 10 | 5 | | | |
| | | EO-TMPTA | 10.12 | 4.56 | 0 | | | | | | | 5 | 10 | 5 |
| Surfactant | | UV-3500 | | | | | | | | | | | | |
| | | F-554 | | | | | | | | | | | | |
| | | R-08 | | | | | | | | | | | | |
| Solvent | | PGMAc | | | | | | | | | | | | |
| Polymerizable compound other than A, B, and C | | NPGDA | 9.42 | 4.43 | 0 | | | | | 10 | | | | |
| | | TPGDA | 6.66 | 5.00 | 0 | | | | | | | | | |
| | | BPADA | 4.52 | 3.63 | 0.33 | | | | | | 45 | | | |
| Total | | | | | | 105 | 105 | 105 | 105 | 105 | 100 | 103 | 103 | 103 |
| Viscosity (without solvent) | | | | | | 40 | 250 | 200 | 350 | 180 | 7600 | 17 | 13 | 9 |
| Concentration of acryloyl group of all polymerizable compounds | | | | | | 6.0 | 5.1 | 5.2 | 5.3 | 5.5 | 4.6 | 5.1 | 6.2 | 6.2 |
| Ratio of polymerizable compounds having Ohnishi parameter of <3.5, ring parameter of >0.35 or greater (% by mass) | | | | | | 90 | 90 | 88 | 85 | 90 | 47 | 95 | 90 | 95 |
| Ratio A/(A + B) with respect to components A and B (%) | | | | | | 72.2 | 72.2 | 62.5 | 58.8 | 55.6 | 88.9 | 89.5 | 61.1 | 63.2 |
| Ratio of component C (% by mass) | | | | | | 10.0 | 10.0 | 2.0 | 15.0 | 10.0 | 5.3 | 5.0 | 10.0 | 5.0 |
| Imprint aptitude | | | Shape (height) | | | A | A | A | A | A | B | A | A | A |
| | | | Releasing from a mold (remaining on mold) | | | A | A | B | A | B | A | A | A | A |
| Dry etching resistance (E/R) | | | BCl3/Cl2/Ar: Sapphire | | | A | A | A | A | B | B | A | A | A |
| | | | CF4/O2: Si | | | A | A | A | A | B | B | A | A | A |

TABLE 3

| Components | | | Concentration of polymerizable group (mmol/g) | Ohnishi parameter | Ring parameter | Comparative Examples | | | | | | | | | |
|---|---|---|---|---|---|---|---|---|---|---|---|---|---|---|---|
| | | | | | | 1 | 2 | 3 | 4 | 5 | 6 | 7 | 8 | 9 | 10 |
| Polymerizable compound A | A-1 | PBA | 4.23 | 2.16 | 0.52 | | | | | | | 20 | | | |
| | A-2 | OPPEA | 3.73 | 2.57 | 0.54 | | | | | | | | 60 | 40 | 55 |
| | A-3 | HRI-02 | 3.87 | 2.46 | 0.465 | | | | | | | | | | |
| | A-4 | BZA | 6.17 | 2.75 | 0.44 | | | | | 70 | 10 | | | | |

TABLE 3-continued

| Components | | Concentration of polymerizable group (mmol/g) | Ohnishi parameter | Ring parameter | Comparative Examples | | | | | | | | | |
|---|---|---|---|---|---|---|---|---|---|---|---|---|---|---|
| | | | | | 1 | 2 | 3 | 4 | 5 | 6 | 7 | 8 | 9 | 10 |
| Polymerizable compound B | FDA | 3.66 | 2.45 | 0.55 | 80 | 80 | | | | | 10 | 40 | | 40 |
| | TCDDA | 6.57 | 3.29 | 0.39 | | | | | | | | | 25 | |
| | ADMODA | 6.57 | 3.29 | 0.39 | | | | | | | | | | |
| Photo-polymerization initiator | IRGACURE 184 | | | | | | | | | | 4 | 4 | 4 | 4 |
| | DAROCUR TPO | | | | | | | | | | 1 | 1 | 1 | 1 |
| | IRGACURE 907 | | | | | | | | 5 | 5 | | | | |
| | IRGACURE OXE 01 | | | | 4.96 | 4.96 | 5 | 5 | | | | | | |
| Polymerizable compound C | DPHA | 10.08 | 5.11 | 0 | | | 30 | 30 | | | 10 | | 35 | 5 |
| | EO-TMPTA | 10.12 | 4.56 | 0 | | | | | | 10 | | | | |
| Surfactant | UV-3500 | | | | | | | | 5 | | | | | |
| | F-554 | | | | | | | | | | | | | |
| | R-08 | | | | | | | | | 0.1 | | | | |
| Solvent | PGMAc | | | | | 104.8 | | | | | | | | |
| Polymerizable compound other than A, B, and C | NPGDA | 9.42 | 4.43 | 0 | 20 | 20 | 70 | 70 | 30 | | 60 | | | |
| | TPGDA | 6.66 | 5.00 | 0 | | | | | | | | 80 | | |
| | BPADA | 4.52 | 3.63 | 0.33 | | | | | | | | | | |
| Total | | | | | 104.96 | 209.8 | 105 | 110 | 105.1 | 105 | 105 | 105 | 105 | 105 |
| Viscosity (without solvent) | | | | | 10000 | 10000 | 60 | 60 | 5 | 10 | 50 | 1500 | 450 | 1700 |
| Concentration of acryloyl group of all polymerizable compounds | | | | | 4.8 | 4.8 | 9.6 | 9.6 | 7.1 | 7.0 | 7.9 | 3.7 | 6.7 | 4.0 |
| Ratio of polymerizable compounds having Ohnishi parameter of <3.5, ring parameter of >0.35 or greater (% by mass) | | | | | 80 | 80 | 0 | 0 | 70 | 10 | 30 | 100 | 65 | 95 |
| Ratio A/(A + B) with respect to components A and B (%) | | | | | 0.0 | 0.0 | | | 100.0 | 100.0 | 66.7 | 60.0 | 61.5 | 57.9 |
| Ratio of component C (% by mass) | | | | | 0.0 | 0.0 | 30.0 | 28.6 | 0.0 | 10.0 | 10.0 | 0.0 | 35.0 | 5.0 |
| Imprint aptitude | Shape (height) | | | | C | C | A | A | C | A | C | A | C | A |
| | Releasing from a mold (remaining on mold) | | | | A | A | C | C | C | A | C | C | C | C |
| Dry etching resistance (E/R) | BCl3/Cl2/Ar: Sapphire | | | | B | B | C | C | A | C | C | A | B | B |
| | CF4/O2: Si | | | | B | B | C | C | A | C | C | A | B | B |

<Polymerizable Compound A>

A-1: compound described in Synthesis Example 1

A-2: o-phenylphenol ethylene oxide-modified acrylate (ARONIX M-106, manufactured by TOAGOSEI CO., LTD.)

A-3: 2-(naphthalen-2-ylthio)ethyl acrylate (Electromer HRI-02, manufactured by Daelim Chemical Co., Ltd.)

A-4: benzylacrylate (VISCOAT #160, manufactured by OSAKA ORGANIC CHEMICAL INDUSTRY LTD.)

<Polymerizable Compound B>

FDA: 9,9-bis[4-(2-acryloyloxyethoxy)phenyl]fluorene (OGSOL EA-0200, manufactured by Osaka Gas Chemicals Co., Ltd.)

TCDDA: tricyclodecane dimethanol diacrylate (MIRAMER M-260, manufactured by Miwon Commercial Co., Ltd.)

ADMODA: adamantane dimethanol diacrylate (ADAMANTATE DMODA, manufactured by Idemitsu Kosan Co., Ltd.)

<Photopolymerization Initiator>

IRGACURE 184: 1-hydroxy-cyclohexyl-phenyl-ketone (manufactured by BASF Japan Ltd.)

IRGACURE 907: 2-methyl-1-[4-(methylthio)phenyl]-2-morpholinopropan-1-one (manufactured by BASF Japan Ltd.)

DAROCUR TPO: 2,4,6-trimethylbenzoyl-diphenyl-phosphine oxide (manufactured by BASF Japan Ltd.)

IRGACURE OXE01: 1,2-octanedione, 1-[4-(phenylthio)-, 2-(O-benzoyloxime)] (manufactured by BASF Japan Ltd.)

<Polymerizable Compound C: Compound Having Three or More Polymerizable Groups in a Molecule>

DPHA: mixture of dipentaerythritol hexaacrylate and dipentaerythritol pentaacrylate (LUMICURE DPC-620C, manufactured by TOAGOSEI CO., LTD.)

EO-TMPTA: ethylene oxide-modified trimethylolpropane triacrylate (SR-454, manufactured by Sartomer Company, Inc.)

<Other Polymerizable Compounds>

NPGDA: neopentyl glycol diacrylate (light acrylate NP-A, manufactured by KYOEISHA CHEMICAL Co., LTD)

TPGDA: tripropylene glycol diacrylate (ARONIX M-220, manufactured by TOAGOSEI CO., LTD.)

<Solvent>

PGMAc: propylene glycol monomethyl ether acetate

<Surfactant>

UV-3500: silicon-based surfactant (manufactured by BYK Japan K.K.)

F-554: fluorine-based surfactant (manufactured by DIC Corporation)

R-08: fluorine-based surfactant (manufactured by DIC Corporation)

Comparative Examples 1 and 2

The imprint aptitude and dry etching resistance were evaluated. Filling properties in a mold were poor because of high viscosity of the compositions even though the dry etching resistance was excellent, and pattern forming properties were poor.

Comparative Examples 3 and 4

The imprint aptitude and dry etching resistance were evaluated. The filling properties in a mold were not problematic because of low viscosity of the compositions, but it was confirmed that adhesiveness to the substrate was poor and the pattern was peeled off because the concentration of the polymerizable groups of the compositions was higher than the preferred range. Moreover, since the polymerizable compounds A and B were not contained, dry etching resistance was poor.

Comparative Example 5

The imprint aptitude and dry etching resistance were evaluated. Since the polymerizable compound C was not contained, the cohesive force of a cured product was weak, and defect and collapse of the pattern were confirmed at the time of releasing from a mold.

Comparative Example 6

The imprint aptitude and dry etching resistance were evaluated. The dry etching resistance was inferior to that of Examples because the ratio of polymerizable compounds A and B was low even though the pattern forming properties were excellent.

Comparative Example 7

The imprint aptitude and dry etching resistance were evaluated. It was confirmed that adhesiveness to the substrate was poor and the pattern was peeled off because the concentration of the polymerizable group of the composition was higher than the preferred range. The dry etching resistance was inferior to that of Examples because the ratio of polymerizable compounds A and B was low.

Comparative Example 8

The imprint aptitude and dry etching resistance were evaluated. Since the concentration of the polymerizable group of the composition was lower than the preferred range and the polymerizable compound C was not contained, the cohesive force of a cured product was weak, and defect and collapse of the pattern were confirmed at the time of releasing from a mold.

Comparative Example 9

The imprint aptitude and dry etching resistance were evaluated. The filling properties in a mold were not problematic because of low viscosity of the composition. However, since the concentration of the polymerizable compound having three or more polymerizable groups was high, it was confirmed that the adhesiveness to the substrate was poor and the pattern was peeled off.

Comparative Example 10

The imprint aptitude and dry etching resistance were evaluated. The filling properties in a mold were not problematic because of low viscosity of the composition. However, since the concentration of the polymerizable group of the composition was low, defect and collapse of the pattern were confirmed at the time of releasing from a mold.

INDUSTRIAL APPLICABILITY

The curable composition for imprinting of the present invention can be used for various imprint techniques and preferably used particularly as a curable composition for forming a nanosized fine pattern. Specifically, the curable composition can be used for preparation of a semiconductor integrated circuit, a micro-electromechanical system (MEMS), a sensor element, a magnetic recording medium such as an optical disk, or a high density memory disk; an optical component such as a diffraction grating or a relief hologram; an optical film or a polarizing element for preparing a nanodevice, an optical device, or a flat panel display; a thin film transistor of a liquid crystal display; an organic transistor; a color filter; an overcoat layer; an microlens array; an immunoassay chip; a DNA separation chip; a microreactor; a nano-bio device; an optical waveguide; an optical filter; and a photonic liquid crystal.

The invention claimed is:

1. A curable composition for imprinting, comprising:
   polymerizable compounds comprising a polymerizable compound X and a polymerizable compound C,
   wherein the concentration of polymerizable groups in the polymerizable compounds is in the range of 4.3 mmol/g to 7.5 mmol/g,
   wherein the polymerizable compound X has Ohnishi parameter that is 3.5 or less and ring parameter that is 0.35 or greater and is contained in the range of 40% by mass to 95% by mass with respect to all the polymerizable compounds,
   wherein the polymerizable compound C has three or more polymerizable groups and is contained in the range of 2% by mass to 20% by mass with respect to all the polymerizable compounds, and
   when the composition does not contain a solvent, the viscosity of the composition at 25° C. is in the range of 3 mPa·s to 2,000 mPa·s,
   with the proviso that the Ohnishi parameter used here is represented by $N/(N_C-N_O)$ wherein the total number of atoms in the polymerizable compound is set as N, the total number of carbon atoms therein is set as $N_C$, and the total number of oxygen atoms therein is set as $N_O$, and the ring parameter is represented by $M_{CYCLO}/M$ wherein the total atomic weight of carbon atoms in a cyclic structure in the polymerizable compound is set as $M_{CYCLO}$ and the molecular weight of the compound is set as M.

2. The curable composition for imprinting according to claim 1, comprising, as the polymerizable compound X:
   a polymerizable compound A which includes an aromatic ring and a polymerizable group; and
   a polymerizable compound B which is represented by the following Formula (1), (2), or (3),
   wherein the total content of the polymerizable compound A and the polymerizable compound B is set as 100 parts by mass, and the weight ratio of the polymerizable compound A to the polymerizable compound B is in the range of 95:5 to 55:45;

[Chem. 1]

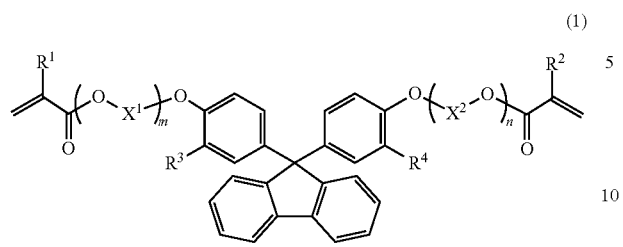
(1)

wherein $R^1$, $R^2$, $R^3$, and $R^4$ each independently represent H or $CH_3$, $X^1$ and $X^2$ each independently represent a hydrocarbon group having 2 or more carbon atoms, and m and n each independently represent an integer of 0 or 1 to 5;

[Chem. 2]

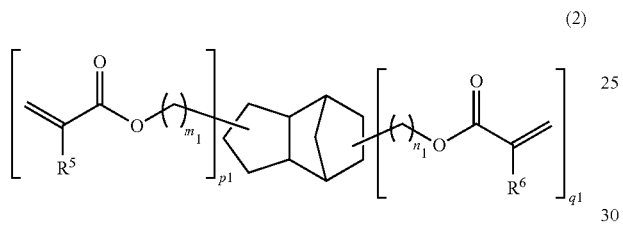
(2)

wherein $R^5$ and $R^6$ each independently represent H or $CH_3$, $m_1$ and $n_1$ each represent 0 or 1, and $p_1$ and $q_1$ represent an integer satisfying a relationship of "$p_1+q_1=1$ or 2";

[Chem. 3]

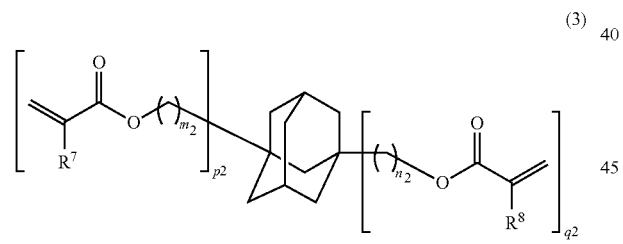
(3)

wherein $R^7$ and $R^8$ each independently represent H or $CH_3$, $m_2$ and $n_2$ each represent 0 or 1, and $p_2$ and $q_2$ represent an integer satisfying a relationship of "$p_2+q_2=1$ or 2".

3. The curable composition for imprinting according to claim 2, wherein the polymerizable compound A has at least one of a phenyl group, a biphenyl group and a naphthyl group.

4. The curable composition for imprinting according to claim 2, wherein the polymerizable compound A is monofunctional.

5. The curable composition for imprinting according to claim 4, wherein the polymerizable compound A has at least one of a phenyl group, a biphenyl group and a naphthyl group.

6. The curable composition for imprinting according to claim 4, wherein the polymerizable compound A is represented by the following Formula (4), (5), (7), or (8),

(4)

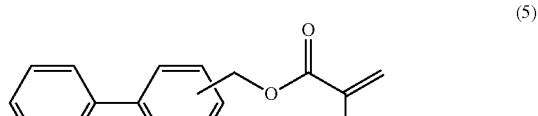
(5)

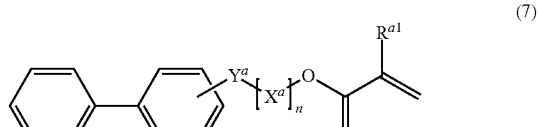
(7)

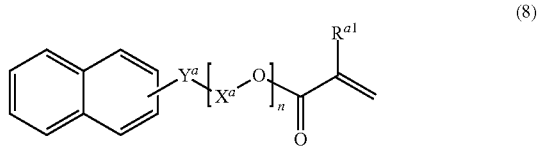
(8)

wherein in the formulae (4), (5), (7), and (8), $R^{a1}$ represents H or $CH_3$, $X^a$ represents a hydrocarbon group having 2 or more carbon atoms, $Y^a$ represents an oxygen atom or a sulfur atom, and n represents an integer of 0 or 1 to 5.

7. The curable composition for imprinting according to claim 1, wherein the curable composition is used for dry etching.

8. A product comprising a cured film on a base material, wherein the product is obtained by coating the base material with the curable composition according to claim 1 and curing the coated curable composition to form the cured film.

9. The product according to claim 8, wherein a pattern is formed in the cured film by imprinting the coated curable composition.

10. A method of forming an etch pattern in a base material comprising:
  forming a product in which the pattern is formed according to claim 9 on a base material; and
  etching the base material using the product in which the pattern is formed as a mask.

11. The method of forming an etch pattern in a base material according to claim 10, wherein the etching is dry etching.

12. A product comprising a cured film on a base material, wherein the product is obtained by coating the base material with the curable composition according to claim 2 and curing the coated curable composition to form the cured film.

13. The product according to claim 12, wherein a pattern is formed in the cured film by imprinting the coated curable composition.

14. A method of forming an etch pattern in a base material comprising:
  forming a product in which the pattern is formed according to claim 13 on a base material; and etching the base material using the product in which the pattern is formed as a mask.

15. The method of forming an etch pattern in a base material according to claim 14, wherein the etching is dry etching.

16. A cured product which is obtained by curing the curable composition according to claim 3.

* * * * *